United States Patent

Hart et al.

[11] Patent Number: 5,435,480
[45] Date of Patent: Jul. 25, 1995

[54] METHOD FOR FILLING PLATED THROUGH HOLES

[75] Inventors: Paul J. Hart, Endicott; Kishor V. Desai, Vestal; Edward Vytlacil; Ajit K. Trivedi, both of Endicott, all of N.Y.

[73] Assignee: International Business Machines Corporation, Armonk, N.Y.

[21] Appl. No.: 172,064

[22] Filed: Dec. 23, 1993

[51] Int. Cl.$^6$ ............................................. H05K 3/40
[52] U.S. Cl. ................................ 228/180.1; 29/830; 228/216; 174/264
[58] Field of Search .............. 228/180.1, 180.2, 245, 228/216, 215; 29/830; 174/264

[56] References Cited

U.S. PATENT DOCUMENTS

| | | | |
|---|---|---|---|
| 3,001,057 | 9/1961 | Hackman et al. | 228/216 |
| 4,412,642 | 11/1983 | Fisher, Jr. | 228/173 |
| 4,830,264 | 5/1989 | Bitaillou et al. | 228/180.2 |
| 5,088,639 | 2/1992 | Gondotra et al. | 228/180.1 |
| 5,129,142 | 7/1992 | Bindra et al. | 29/830 X |
| 5,191,174 | 3/1993 | Chang et al. | 29/830 X |
| 5,229,549 | 7/1993 | Yamakawa et al. | 174/264 |

FOREIGN PATENT DOCUMENTS 177889  6/1992  Japan ................................ 228/245

OTHER PUBLICATIONS

Product Brochure, "YR-5414 Water Soluable Wave Solder Tape", 3M.

*Primary Examiner*—Kenneth J. Ramsey
*Attorney, Agent, or Firm*—Pollock, Vande Sande & Priddy

[57] ABSTRACT

Plated thru holes in a printed circuit card or board are filled with solder to provide as void free as possible solder fill. According to one method, an adhesive film is provided on the bottom side of a circuit card or board containing plated thru holes. A plurality of solder balls are then provided within at least one thru hole of the card or board. The total volume of the solder balls is greater than the volume of the plated thru hole. The solder balls are reflowed to thereby fill the plated thru hole with solder and provide solder on top of the thru hole.

According to another method, a solder ball is provided above and in contact with a plated thru hole. The volume of the solder ball is greater than the volume of the plated thru hole. The solder ball is reflowed to thereby fill the plated thru hole with solder, and to provide solder both above and below the plated thru hole.

12 Claims, 1 Drawing Sheet

METHOD FOR FILLING PLATED THROUGH HOLES

TECHNICAL FIELD

The present invention is concerned with filling plated thru holes in a circuit card or board with solder. In particular, the present invention is concerned with significantly reducing, if not entirely eliminating, the formation of voids in the solder fill in the plated thru hole. In particular, the present invention is concerned with methods whereby a plurality of solder balls is provided within a plated thru hole or, wherein a single solder ball is provided on top of the thru hole. In each instance, the solder ball(s) are reflowed to thereby fill the plated thru hole with solder and provide solder on at least the top of the thru hole.

BACKGROUND ART

Interconnection between multi-layer ceramic substrates containing plated thru holes and printed circuit cards has been achieved employing solder ball connections. Typically, a process employing solder ball connection involves attaching 90/10 Pb/Sn solder balls onto the bottom side pads (I/O pads) of the multi-layer ceramic substrate. The solder balls are typically attached employing a eutectic solder, such as a 63/31 Sn/Pb solder. In this way, the solder ball connection module having balls attached thereto, then directly gets attached onto plated thru holes of the printed circuit card, using a reflow process. Typical reflow processes include vapor phase, electroforming process, or an infrared heating process.

However, the relatively low melting eutectic solder tends to flow into the plated thru hole, thereby deleting the same at the joints between the high melting solder ball/module pad, and solder ball/plated thru hole land on the circuit board or card. This, in turn, adversely affects the reliability of the device and provide for potential exposure of electrical opens.

The problem is especially exacerbated by subsequent processing whereby the card goes through subsequent wave solder processing to attach backside components. The wave soldering process in turn can remelt the low melting solder. The flow of the low melting solder during the process into the plated thru hole is referred to as wicking.

SUMMARY OF INVENTION

The present invention provides a process which avoids the wicking experienced in prior attachment processes.

According to one aspect of the present invention, a plated thru hole in a circuit board or card is filled with solder by providing a removal adhesive film on the bottom side of the card or board, and then providing a plurality of solder balls within at least one of the thru holes of the circuit board or card. The total volume of the plurality of the solder balls is greater than the volume of the plated thru holes. The solder balls are reflowed and solidified to thereby fill the plated thru holes with solder, and provide solder on top of the plated thru holes, to create a land for subsequent attachment of solder ball.

According to another method pursuant to the present invention, a solder ball is placed above and in contact with a plated thru hole of a circuit card or board. The solder ball is reflowed and solidified.

The method of the present invention results in substantially void free solder fill within the plated thru hole.

BEST AND VARIOUS MODES FOR CARRYING OUT THE INVENTION

Figure 1:
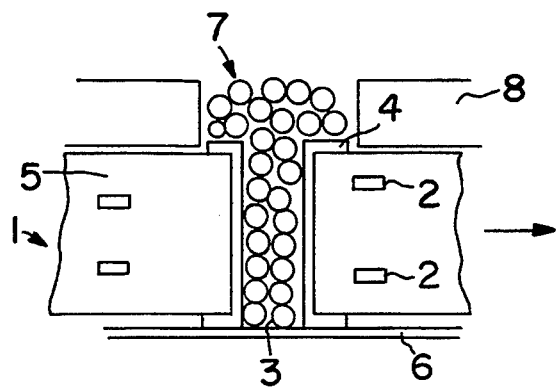
FIG. 1 is a schematic diagram of a first embodiment of the present invention, prior to reflow of the solder balls.

In order to facilitate an understanding of the present invention, reference is made to the figures wherein the same numeral refers to like elements in different figures. Reference to FIG. 1 shows a circuit card 1 containing metallized layer 2 and a thru hole 3 plated with a metal such as copper 4. The circuit card is typically constructed of a dielectric material 5 containing the conductive layers 2, such as copper therein. The dielectric material is typically a cured polymeric composition such as a fiberglass reinforced epoxy resin composition, more typically an FR-4 composition, including those disclosed in U.S. Pat. Nos. 3,523,037 and 4,597,996, disclosures of which are incorporated herein by reference.

A typically FR-4 epoxy composition contains 70–90 parts of brominated polyglycidyl ether of bisphenol-A and 10–30 parts of tetrakis (hydroxyphenyl) ethane tetraglycidyl ether cured with 3 to 4 parts of dicyandiamide, and 0.2 to 0.4 parts of a tertiary amine, all parts being parts by weight per 100 parts of resin solids.

Another typical FR-4 epoxy composition contains:
a) about 25 to about 30 parts by weight of a tetrabrominated digylcidyl ether of bisphenol-A, having an epoxy equivalent weight of about 350 to about 450;
b) about 10 about 15 parts by weight of a tetrabrominated diglycidyl ether of bisphenol-A, having an epoxy equivalent weight of about 600 to about 750; and
c) about 55 to about 65 parts by weight of at least one epoxidized non-linear novolak, having at least terminal epoxy groups, along with suitable curing and/or hardening agents.

Another typical FR-4 epoxy composition contains about 70 to about 90 parts of brominated polyglycidyl ether of bisphenol-A, and 10 to 30 parts of tetrakis (hydroxyphenyl) ethane tetraglycidyl ether cured with 0.8 to 1 phr of 2-methyl imidazole.

Still another FR-4 epoxy composition employs tetrabromo bisphenol-A as the curing agent, along with 2-methyl imidazole as the catalyst.

FIG. 1 illustrates providing an adhesive film 5 on the bottom side 6 of the metallized circuit card 1.

Typical adhesive films are the polyimides. Such include unmodified polyimides, as well as modified polyimides, such as polyester imides, polyamide-imide esters, polyamide-imides, polysiloxanes-imides, as well as other mixed polyimides. Such are well known in the prior art, and need not be described in any great detail herein.

Generally, the polyimides include the following recurring unit:

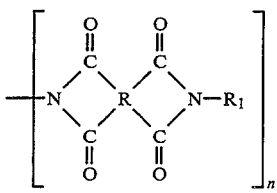

where n is an integer representing the number of repeating units to provide a molecular weight usually about 10,000 to about 100,000. R is at least one tetravalent organic radical selected from the group consisting of:

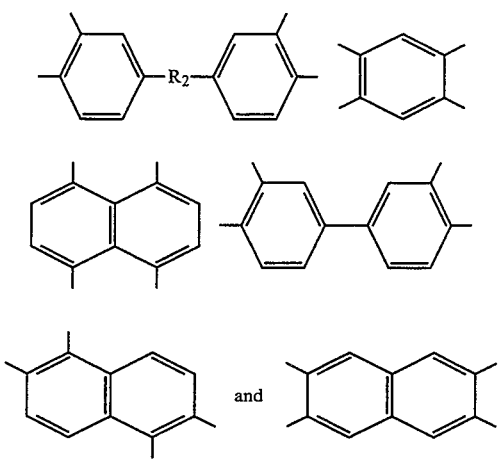

$R_2$ being selected from the group consisting of divalent aliphatic hydrocarbon radicals having from 1 to 4 carbon atoms and carbonyl, oxy, sulfo, hexafluoroisopropylidene and sulfonyl radicals, and in which $R_1$ is at least one divalent radical selected from the group consisting of:

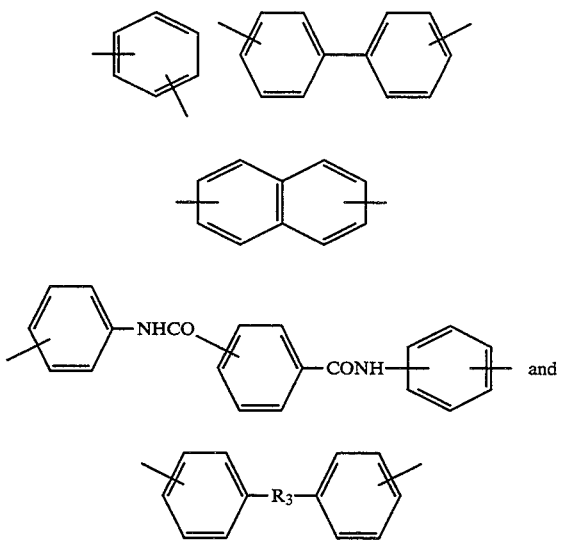

in which $R_3$ is a divalent organic radical selected from the group consisting of $R_2$, silicon, and amino radicals. Polymers containing two or more of the R and/or $R_1$ radicals, especially multiple series of $R_1$ containing amido radicals, can be used.

Commercially available polyimide precursors (polyamic acid) are various polyimide precursors from DuPont and available under the trade designation Pyralin. These polyimide precursors come in many grades, including those available Pyralin polyimide precursors from DuPont under the further trade designations PI-2555, PI-2545, PI-2560, PI-5878, PIH-61454, and PI-2540. Some of these are the pyro-melletic Dianhydride-Oxydianiline (PMDA-ODA) polyimide precursors.

Commercially available chemically cured polyimides are various polyimides from DuPont and available under the trade designation Kapton, including H-Kapton, V-Kapton, HN-Kapton, and VN-Kapton, which are all chemically cured polyimides. The chemically cured polyimides are generally cured with an anhydride curing agent, such as acetic anhydride.

According to the embodiment illustrated in FIG. 1, the plated thru hole is filled with a plurality of solder balls 7. The solder balls can be the relatively low melting eutectic solder balls, such as the 63/37 Sn/Pb solder balls, of the relatively high melting solder balls, such as those having a melting point greater than the glass transition temperature of the circuit board, such as a 10/90-Sn/Pb solder ball. Preferably, the solder balls are coated with a solder paste or solder flux composition, in order to reduce the surface tension and help in the soldering process. Suitable solder flux compositions include those available under the trade designations as alpha water soluble 1208 solder paste and Kester 244 solder paste.

The solder paste composition typically contains about 85 to 90% by weight of metal powder, such as tin/lead, silver, bismuth or indium, and about 10–15% of flux, such as rosin based material. The metal powder typically has a grind of about 55 microns or less. The Brookfield viscosity of the paste is typically about 900 to 1000±10% centipoise at 25° C.

A template 8 is provided on the top surface of the printed circuit card, in order to facilitate and control the flow of the solder balls into the plated thru hole. The template or stencil is typically a stainless steel, and has a thickness of about 8 mils. The volume of the solder balls 7 is based upon the size of the card, via (plated thru hole volume) and the desired amount of solder land.

The adhesive layer 6 precludes the solder balls from exiting the thru hole. The height and diameter of the template provides for the void free filling of the plated thru hole by having additional solder balls required, in order to fill up the plated thru hole, and also to provide a fillet or land on the top surface of the circuit card. The diameter of the holes in the template are greater than the diameter of the plated thru holes, and are typically about 10% greater, in order to compensate for any misregistration of the template on the circuit card.

The balls 7 are caused to reflow by employing a vapor phase, an infrared heating process, or a hot thermode process. When the melting point of the solder balls is greater than the glass transition temperature of the circuit cards, then the heating process employed should be one that heats the ball to the reflow temperature, without heating the circuit card to the glass transition temperature of the circuit card. This is preferably accomplishing by employing a hot thermode heating process.

Figure 2:
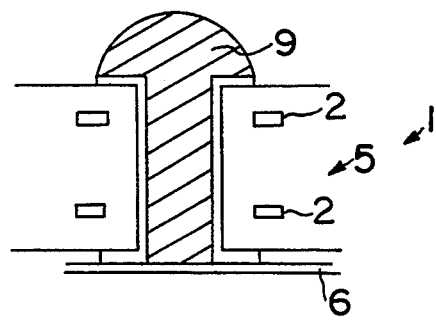
FIG. 2 is a schematic diagram of the first embodiment of the present invention, after reflow of the solder balls.

FIG. 2 illustrates the composite after reflowing and solidification of the solder. The product contains a fillet or land of solder 9 on the top surface of the card, to provide for subsequent attachment to a ceramic substrate. Upon completion of the process, the adhesive layer 6 is removed.

Figure 3:
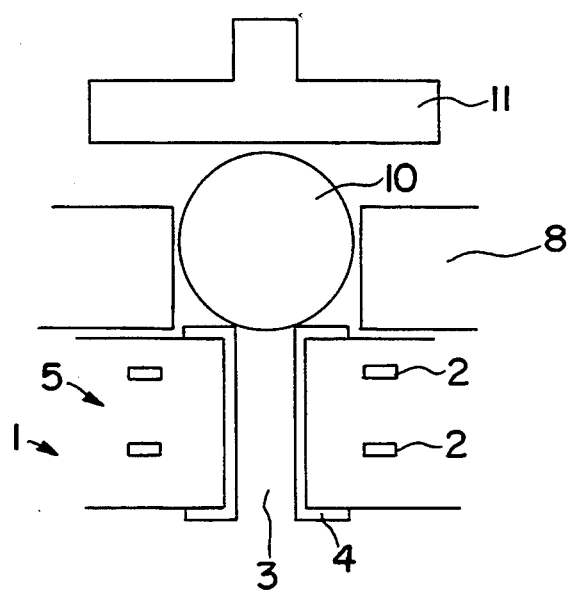
FIG. 3 is a schematic diagram of a second embodiment of the present invention, prior to reflow of the solder ball.

FIG. 3 illustrates another and the most preferred embodiment of the present invention, wherein a single ball 10 is provided for a particular plated thru hole. The solder ball 10 can be made of the same materials including the flux as discussed above for the embodiment that employs a plurality of solder balls, and preferably is a relatively high melting solder ball, having a melting point greater than the glass transition temperature of the circuit card. The diameter of the solder ball 10 is greater than the diameter of the plated thru hole, and less than the openings in the template. However, the diameter of the solder ball is greater than the height of the template, in order for it in the preferred embodiment to be physically contacted with a thermode 11, in order to cause reflowing of the solder ball 10. Although the solder ball can be caused to reflow by the other methods discussed above, such as vapor phase or infrared heating, the preferred method is the thermode process.

Figure 4:
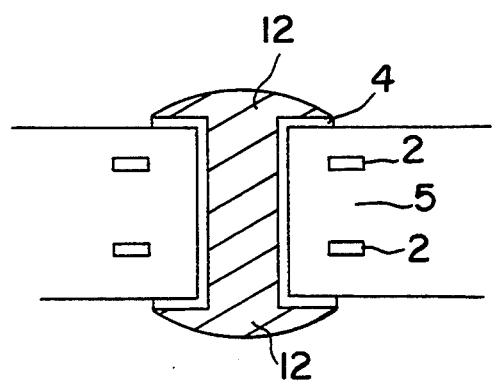
FIG. 4 is a schematic diagram of the second embodiment of the present invention, after reflow of the solder ball.

Preferably, the volume of the solder ball is calculated so that upon reflow and subsequent solidification 2 by cooling to below the melting point, such will fill the plated thru hole, as well as provide a fillet or land 12 both above and below the circuit card (see FIG. 4).

In either of the above processes, in the event additional solder balls are needed to fill the thru hole after the initial reflow and solidification of the solder ball or balls, an additional solder ball or balls can be added and then reflowed and solidified. This procedure can be repeated as many times as is necessary to obtain the desired fill and land configuration. In other words, the filling of the plated thru hole can be carried out employing only one reflow and one solidification step, or employing a plurality of sequential fill, reflow and solidification steps.

What is claimed is:

1. A method for filling a plated thru hole in an integrated circuit card or board with solder which comprises providing an adhesive film on the bottom side of a circuit card of board containing thru holes;

providing a plurality of solder balls within at least one hole of said circuit card of board, wherein the total volume of said plurality of solder balls is greater than the volume of said plated thru holes;

reflowing said solder balls to thereby fill said plated thru hole with solder and provide solder on top of said thru hole.

2. The method of claim 1 wherein the solder balls contain a flux coating thereon.

3. The method of claim 1 wherein the solder balls include 63/37 Sn/Pb solder balls.

4. The method of claim 1 wherein the solder balls include 1.0/90 Sn/Pb solder balls.

5. The method of claim 1 wherein a template is provided on the top surface of said printed circuit card or board to control the flow of solder balls into said plated thru hole.

6. The method of claim 1 wherein said adhesive film is a polyimide.

7. The method of claim 1 wherein said polyimide is about 2 to about 4 mils thickness.

8. The method of claim 1 wherein said circuit card or board is reinforced epoxy resin.

9. The method of claim 1 wherein said thru hole is coated with copper.

10. The method of claim 1 wherein any one reflow step and one solidification step are employed.

11. The method of claim 1 wherein a plurality of sequential fill, reflow and solidification steps is employed.

12. The method of claim 1 wherein said adhesive film is removable and which further comprises removing said adhesive film after reflowing of said solder balls.

* * * * *